(12) United States Patent
Bradley et al.

(10) Patent No.: US 8,767,978 B2
(45) Date of Patent: Jul. 1, 2014

(54) SYSTEM AND METHOD FOR PROCESSING SOUND SIGNALS IMPLEMENTING A SPECTRAL MOTION TRANSFORM

(75) Inventors: David C. Bradley, La Jolla, CA (US);
Daniel S. Goldin, Malibu, CA (US);
Robert N. Hilton, San Diego, CA (US);
Nicholas K. Fisher, San Diego, CA (US); Rodney Gateau, San Diego, CA (US); Derrick R. Roos, San Diego, CA (US); Eric Wiewiora, San Diego, CA (US)

(73) Assignee: The Intellisis Corporation, San Diego, CA (US)

( * ) Notice: Subject to any disclaimer, the term of this patent is extended or adjusted under 35 U.S.C. 154(b) by 240 days.

(21) Appl. No.: 13/205,424

(22) Filed: Aug. 8, 2011

(65) Prior Publication Data

US 2012/0243707 A1 Sep. 27, 2012

Related U.S. Application Data

(60) Provisional application No. 61/467,493, filed on Mar. 25, 2011.

(51) Int. Cl.
*H03G 5/00* (2006.01)
(52) U.S. Cl.
USPC .............................................. 381/98; 381/61
(58) Field of Classification Search
CPC ....... H03G 5/00; H03G 5/005; H03G 5/0025; H03G 5/165; H04S 7/307; H04R 3/04
USPC ............. 381/98–104, 61; 704/205, 221, 226, 704/231, 233, 246; 700/94
See application file for complete search history.

(56) References Cited

U.S. PATENT DOCUMENTS

| 5,815,580 A | * | 9/1998 | Craven et al. .................... 381/58 |
| 7,117,149 B1 | | 10/2006 | Zakarauskas ................ 704/233 |

(Continued)

FOREIGN PATENT DOCUMENTS

| WO | WO 2012/129255 | 9/2012 |
| WO | WO 2012/134991 | 10/2012 |
| WO | WO 2012/134993 | 10/2012 |

OTHER PUBLICATIONS

Kumar et al., "Speaker Recognition Using GMM", *International Journal of Engineering Science and Technology*, vol. 2, No. 6, 2010, [retrieved on: May 31, 2012], retrieved from the Internet: http://www.ijest.info/docs/IJEST10-02-06-112.pdf, pp. 2428-2436.

(Continued)

*Primary Examiner* — Xu Mei
(74) *Attorney, Agent, or Firm* — Pillsbury Winthrop Shaw Pittman LLP

(57) ABSTRACT

A system and method are provided for processing sound signals. The processing may include identifying individual harmonic sounds represented in sound signals, determining sound parameters of harmonic sounds, classifying harmonic sounds according to source, and/or other processing. The processing may include transforming the sound signals (or portions thereof) into a space which expresses a transform coefficient as a function of frequency and chirp rate. This may facilitate leveraging of the fact that the individual harmonics of a single harmonic sound may have a common pitch velocity (which is related to the chirp rate) across all of its harmonics in order to distinguish an the harmonic sound from other sounds (harmonic and/or non-harmonic) and/or noise.

20 Claims, 5 Drawing Sheets

(56) References Cited

U.S. PATENT DOCUMENTS

| | | | |
|---|---|---|---|
| 7,249,015 B2 | 7/2007 | Jiang et al. | 704/222 |
| 7,389,230 B1 | 6/2008 | Nelken | 704/255 |
| 7,596,489 B2 | 9/2009 | Kovesi et al. | 704/219 |
| 7,664,640 B2 | 2/2010 | Webber | 704/243 |
| 7,668,711 B2 * | 2/2010 | Chong et al. | 704/219 |
| 7,774,202 B2 | 8/2010 | Spengler et al. | 704/236 |
| 7,991,167 B2 | 8/2011 | Oxford | 381/92 |
| 8,447,596 B2 | 5/2013 | Avendano et al. | 704/226 |
| 2004/0128130 A1 | 7/2004 | Rose et al. | 704/236 |
| 2004/0176949 A1 | 9/2004 | Wenndt et al. | 704/203 |
| 2004/0220475 A1 | 11/2004 | Szabo et al. | 600/458 |
| 2005/0114128 A1 | 5/2005 | Hetherington et al. | 704/233 |
| 2006/0100866 A1 | 5/2006 | Alewine et al. | 704/226 |
| 2006/0122834 A1 | 6/2006 | Bennett | 704/256 |
| 2006/0262943 A1 | 11/2006 | Oxford | 381/92 |
| 2007/0010997 A1 | 1/2007 | Kim | 704/208 |
| 2008/0082323 A1 | 4/2008 | Bai et al. | 704/214 |
| 2009/0012638 A1 | 1/2009 | Lou | 700/94 |
| 2009/0076822 A1 | 3/2009 | Sanjaume | 704/268 |
| 2009/0228272 A1 | 9/2009 | Herbig et al. | 704/233 |
| 2010/0260353 A1 | 10/2010 | Ozawa | 381/94.3 |
| 2010/0332222 A1 | 12/2010 | Bai et al. | 704/214 |
| 2011/0016077 A1 | 1/2011 | Vasilache et al. | 706/52 |
| 2011/0060564 A1 | 3/2011 | Hoge | 703/2 |
| 2011/0286618 A1 | 11/2011 | Vandali et al. | 381/320 |
| 2012/0243694 A1 | 9/2012 | Bradley et al. | 381/56 |
| 2012/0243705 A1 | 9/2012 | Bradley et al. | 381/94.4 |
| 2013/0041489 A1 | 2/2013 | Bradley et al. | 700/94 |
| 2013/0041656 A1 | 2/2013 | Bradley et al. | 704/207 |
| 2013/0041658 A1 | 2/2013 | Bradley et al. | 704/208 |
| 2014/0037095 A1 | 2/2014 | Bradley et al. | 381/56 |

OTHER PUBLICATIONS

Kamath et al, "Independent Component Analysis for Audio Classification", *IEEE 11$^{th}$ Digital Signal Processing Workshop & IEEE Signal Processing Education Workshop*, 2004, [retrieved on: May 31, 2012], retrieved from the Internet: http://2002.114.89.42/resource/pdf/1412.pdf, pp. 352-255.

Vargas-Rubio et al., "An Improved Spectrogram Using the Multiangle Centered Discrete Fractional Fourier Transform", *Proceedings of International Conference on Acoustics, Speech, and Signal Processing*, Philadelphia, 2005 [retrieved on Jun. 24, 2012], retrieved from the internet: <URL:http://www.ece.unm.edu/faculty/beanthan/PUB/ICASSP-05-JUAN.pdf>, 4 pages.

Serra, "Musical Sound Modeling with Sinusoids plus Noise", 1997, pp. 1-25.

* cited by examiner

SYSTEM AND METHOD FOR PROCESSING SOUND SIGNALS IMPLEMENTING A SPECTRAL MOTION TRANSFORM

RELATED APPLICATIONS

This application claims priority from U.S. Provisional Patent Application No. 61/467,493, entitled "SPECTRAL MOTION TRANSFORM," and filed Mar. 25, 2011, which is hereby incorporated by reference in its entirety in to the present application.

FIELD

The invention relates to the processing of a sound signal to identify, determine sound parameters of, and/or classify harmonic sounds by leveraging the coordination of chirp rate for harmonics associated with individual harmonic sounds.

BACKGROUND

Systems that process audio signals to distinguish between harmonic sounds represented in an audio signal and noise, determine sound parameters of harmonic sounds represented in an audio signal, classify harmonic sounds represented in an audio signal by grouping harmonic sounds according to source, and/or perform other types of processing of audio are known. Such systems may be useful, for example, in detecting, recognizing, and/or classifying by speaker, human speech, which is comprised of harmonic sounds. Conventional techniques for determining sound parameters of harmonic sounds and/or classifying harmonic sounds may degrade quickly in the presence of relatively low amounts of noise (e.g., audio noise present in recorded audio signals, signal noise, and/or other noise).

Generally, conventional sound processing involves converting an audio signal from the time domain into the frequency domain for individual time windows. Various types of signal processing techniques and algorithms may then be performed on the signal in the frequency domain in an attempt to distinguish between sound and noise represented in the signal before further processing can be performed. This processed signal may then be analyzed to determine sound parameters such as pitch, envelope, and/or other sound parameters. Sounds represented in the signal may be classified.

Conventional attempts to distinguish between harmonic sound and noise (whether sonic noise represented in the signal or signal noise) may amount to attempts to "clean" the signal to distinguish between harmonic sounds and background noise. Unfortunately, often times these conventional techniques result in a loss of information about harmonic sounds represented in the signal, as well as noise. The loss of this information may impact the accuracy and/or precision of downstream processing to, for example, determine sound parameter(s) of harmonic sound, classify harmonic sounds, and/or other downstream processing.

SUMMARY

One aspect of the disclosure relates to a system and method for processing sound signals. The processing may include identifying individual harmonic sounds represented in sound signals, determining sound parameters of harmonic sounds, classifying harmonic sounds according to source, and/or other processing. The processing may include transforming the sound signals (or portions thereof) from the time domain into the frequency-chirp domain. This may leverage the fact that the individual harmonics of a single harmonic sound may have a common pitch velocity (which is related to the chirp rate) across all of its harmonics in order to distinguish an the harmonic sound from other sounds (harmonic and/or non-harmonic) and/or noise.

It will be appreciated that the description herein of "sound signal" and "sound" (or "harmonic sound") is not intended to be limiting. The scope of this disclosure includes processing signals representing any phenomena expressed as harmonic wave components in any range of the ultra-sonic, sonic, and/or sub-sonic spectrum. Similarly, the scope of this disclosure includes processing signals representing any phenomena expressed as harmonic electromagnetic wave components. The description herein of "sound signal" and "sound" (or "harmonic sound") is only part of one or more exemplary implementations.

A system configured to process a sound signal may comprise one or more processors. The processor may be configured to execute computer program modules comprising one or more of a signal module, a time window module, a transform module, a sound module, a sound parameter module, a classification module, and/or other modules.

The time window module may be configured to separate the sound signal into signal portions. The signal portions may be associated with individual time windows. The time windows may correspond to a period of time greater than the sampling period of the sound signal. One or more of the parameters of the time windows (e.g., the type of time window function (e.g. Gaussian, Hamming), the width parameter for this function, the total length of the time window, the time period of the time windows, the arrangement of the time windows, and/or other parameters) may be set based on user selection, preset settings, the sound signal being processed, and/or other factors.

The transform module may be configured to transform the signal portions into the frequency-chirp domain. The transform module may be configured such that the transform specifies a transform coefficient as a function of frequency and fractional chirp rate for the signal portion. The fractional chirp rate may be chirp rate divided by frequency. The transform coefficient for a given transformed signal portion at a specific frequency and fractional chirp rate pair may represent the complex transform coefficient, the modulus of the complex coefficient, or the square of that modulus, for the specific frequency and fractional chirp rate within the time window associated with the given transformed signal portion.

The transform module may be configured such that the transform of a given signal portion may be obtained by applying a set of filters to the given signal portion. The individual filters in the set of filters may correspond to different frequency and chirp rate pairs. The filters may be complex exponential functions. This may result in the complex coefficients directly produced by the filters including both real and imaginary components. As used herein, the term "transform coefficient" may refer to one such complex coefficient, the modulus of that complex coefficient, the square of the modulus of the complex coefficient, and/or other representations of real and/or complex numbers and/or components thereof.

The sound module may be configured to identify the individual harmonic sounds represented in the signal portions. This may include identifying the harmonic contributions of these harmonic sounds present in the transformed signal portions. An individual harmonic sound may have a pitch velocity as the pitch of the harmonic sound changes over time. This pitch velocity may be global to each of the harmonics, and may be expressed as the product of the first harmonic and the fractional chirp rate of any harmonic. As such, the fractional chirp rate at any given point in time (e.g., over a time window of a transformed signal portion) may be the same for all of the harmonics of the harmonic sound. This becomes apparent in the frequency-chirp domain, as the harmonic contributions of an individual harmonic sound may be expressed as maxima in the transformation coefficient arranged in a periodic manner along a common fractional chirp rate row.

If noise present in a transformed signal portion is unstructured (uncorrelated in time) then most (if not substantially all) noise present in the signal portion can be assumed to have a fractional chirp rate different from a common fractional chirp rate of a harmonic sound represented in the transformed signal portion. Similarly, if a plurality of harmonic sounds are represented in a transformed signal portion, the different harmonic sounds may likely have different pitch velocities. This may result in the harmonic contributions of these different harmonic sounds being arranged along different fractional chirp rate rows in the frequency-chirp domain. The sound module may be configured to leverage this phenomenon to identify contributions of individual harmonic sounds in transformed signal portions. For example, the sound module may be configured to identify a common fractional chirp rate of an individual sound within a transformed signal portion.

The sound parameter module may be configured to determine, based on the transformed signal portions, one or more sound parameters of individual harmonic sounds represented in the sound signal. The one or more sound parameters may be determined on a per signal portion basis. Per signal portion determinations of a sound parameter may be implemented to track the sound parameter over time, and/or to determine an aggregated value for the sound parameter and/or aggregated metrics associated therewith. The one or more sound parameters may include, for example, a pitch, a pitch velocity, an envelope, and/or other parameters. The sound parameter module may be configured to determine one or more of the sound parameters based on analysis of the transform coefficient versus frequency information along a fractional chirp rate that corresponds to an individual harmonic sound (e.g., as identified by the sound module).

The classification module may be configured to groups sounds represented in the transformed signal portions according to common sound sources. This grouping may be accomplished through analysis of transform coefficients of the transformed signal portions. For example, the classification module may group sounds based on parameters of the sounds determined by the sound parameter module, analyzing the transform coefficient versus frequency information along a best chirp row (e.g., including creating vectors of transform coefficient maxima along the best chirp row), and/or through other analysis.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

DETAILED DESCRIPTION

Figure 1:
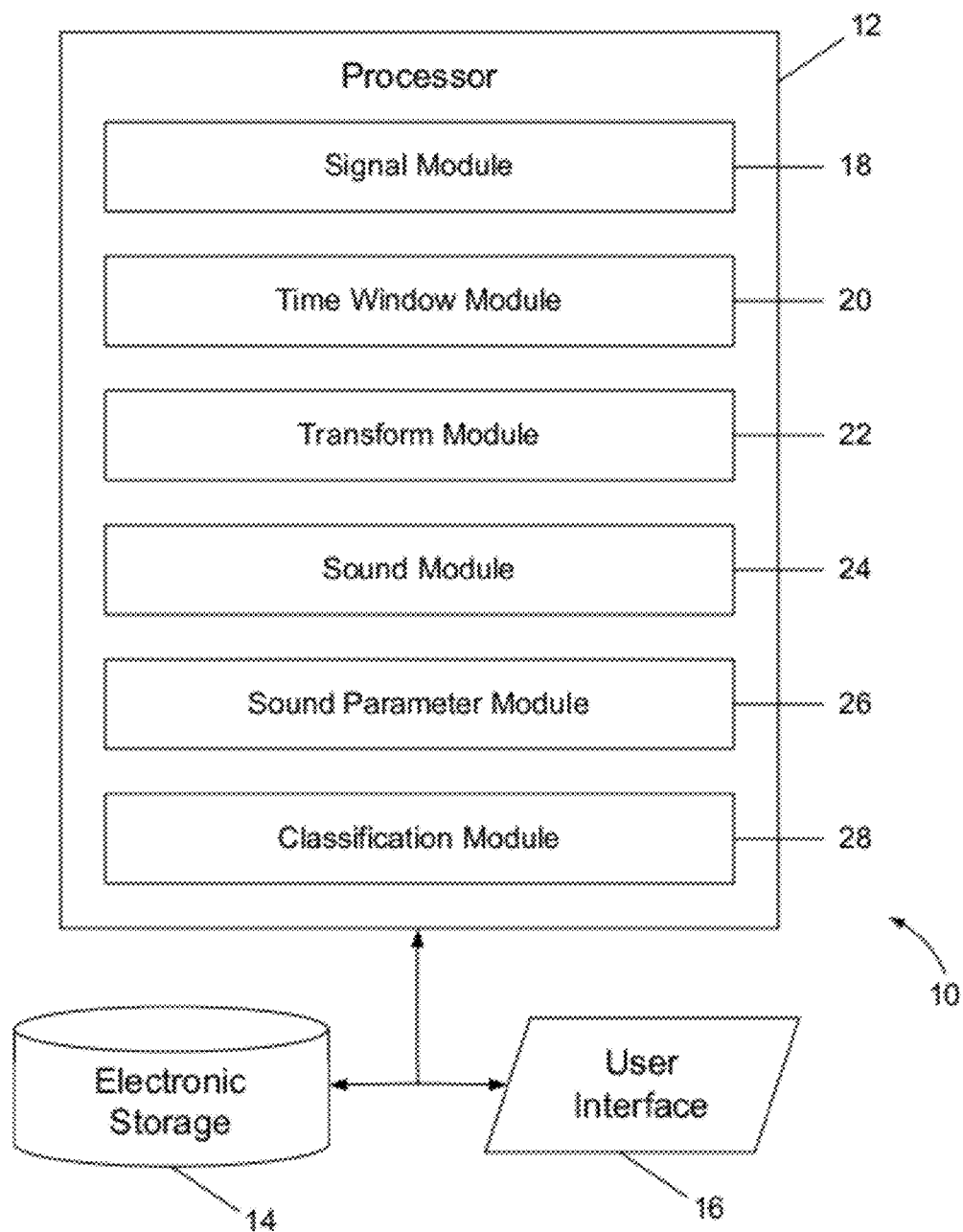
FIG. 1 illustrates a system configured to process sound signals.

FIG. 1 illustrates a system 10 configured to process a sound signal. The processing performed by system 10 may include determining one or more sound parameters represented in the sound signal, identifying sounds represented in the sound signal that have been generated by common sources, and/or performing other processing. System 10 may have an improved accuracy and/or precision with respect to conventional sound processing systems, system 10 may provide insights regarding sounds represented in the sound signal not available from conventional sound processing systems, and/or may provide other enhancements. In some implementations, system 10 may include one or more processors 12, electronic storage 14, a user interface 16, and/or other components.

The processor 12 may be configured to execute one or more computer program modules. The computer program modules may include one or more of a signal module 18, a time window module 20, a transform module 22, a sound module 24, a sound parameter module 26, a classification module 28, and/or other modules.

The signal module 18 may be configured to obtain sound signals for processing. The signal module 18 may be configured to obtain a sound signal from electronic storage 14, from user interface 16 (e.g., a microphone, a transducer, and/or other user interface components), from an external source, and/or from other sources. The sound signals may include electronic analog and/or digital signals that represents sounds generated by sources and/or noise. As used herein, a "source" may refer to an object or set of objects that operate to produce a sound. For example, a stringed instrument, such as a guitar may be considered as an individual source even though it may itself include a plurality of objects cooperating to generate sounds (e.g., a plurality of strings, the body, and/or other objects). Similarly, a group of singers may generate sounds in concert to produce a single, harmonic sound.

Figure 2:
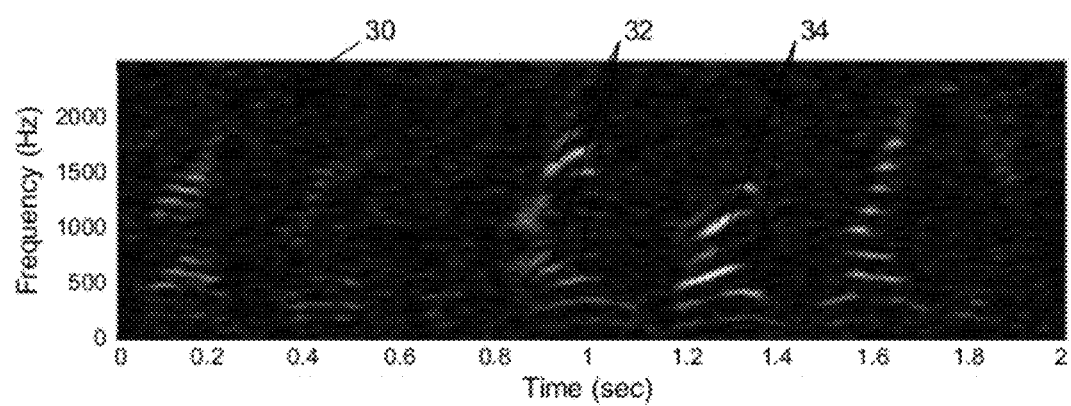
FIG. 2 illustrates a spectrogram of a sound signal.

The signal module 18 may be configured such that the obtained sound signals may specify an signal intensity as a function of time. An individual sound signal may have a sampling rate at which signal intensity is represented. The sampling rate may correspond to a sampling period. The spectral density of a sound signal may be represented, for example, in a spectrogram. By way of illustration, FIG. 2 depicts a spectrogram 30 in a time-frequency domain. In spectrogram 30, a coefficient related to signal intensity (e.g., amplitude, energy, and/or other coefficients) may be a co-domain, and may be represented as color (e.g., the lighter color, the greater the amplitude).

In a sound signal, contributions attributable to a single sound and/or source may be arranged at harmonic (e.g., regularly spaced) intervals. These spaced apart contributions to the sound signal may be referred to as "harmonics" or "overtones". For example, spectrogram 30 includes a first set of overtones (labeled in FIG. 2 as overtones 32) associated with a first sound and/or source and a second set of overtones (labeled in FIG. 2 as overtones 34) associated with a second sound and/or source. The first sound and the second sound may have been generated by a common source, or by separate sources. The spacing between a given set of overtones corresponding to a sound at a point in time may be referred to as the "pitch" of the sound at that point in time.

Referring back to FIG. 1, time window module 20 may be configured to separate a sound signal into signal portions. The signal portions may be associated with individual time windows. The time windows may be consecutive across time, may overlap, may be spaced apart, and/or may be arranged over time in other ways. An individual time window may correspond to a period of time that is greater than the sampling period of the sound signal being separated into signal portions. As such, the signal potion associated with a time window may include a plurality of signal samples.

The parameters of the processing performed by time window module 20 may include the type of peaked window function (e.g. Gaussian), the width of this function (for a Gaussian, the standard deviation), the total width of the window (for a Gaussian, typically 6 standard deviations total), the arrangement of the time windows (e.g., consecutively, overlapping, spaced apart, and/or other arrangements), and/or other parameters. One or more of these parameters may be set based on user selection, preset settings, the sound signal being processed, and/or other factors. By way of non-limiting example, the time windows may correspond to a period of time that is between about 5 milliseconds and about 50 milliseconds, between about 5 milliseconds and about 30 milliseconds, between about 5 milliseconds and about 15 milliseconds, and/or in other ranges. Since the processing applied to sound signals by system 10 accounts for the dynamic nature of the sound signals in the signal portions the time windows may correspond to an amount of time that is greater than in conventional sound processing systems. For example, the time windows may correspond to an amount of time that is greater than about 15 milliseconds. In some implementations, the time windows may correspond to about 10 milliseconds.

The chirp rate variable may be a metric derived from chirp rate (e.g., or rate of change in frequency). For example, In some implementations, the chirp rate variable may be the fractional chirp rate. The fractional chirp rate may be expressed as:

$$\chi = X/\omega; \qquad (1)$$

where $\chi$ represents fractional chirp rate, X represents chirp rate, and $\omega$ represents frequency.

The processing performed by transform module 22 may result in a multi-dimensional representation of the audio. This representation, or "space," may have a domain given by frequency and (fractional) chirp rate. The representation may have a co-domain (output) given by the transform coefficient. As such, upon performance of the transform by transform module 22, a transformed signal portion may specify a transform coefficient as a function of frequency and fractional chirp rate for the time window associated with the transformed signal portion. The transform coefficient for a specific frequency and fractional chirp rate pair may represent the complex number directly produced by the transform, the modulus of this complex number, or the square of this modulus, for the specific frequency and fractional chirp rate within the time window associated with the transformed signal portion.

Figure 3:
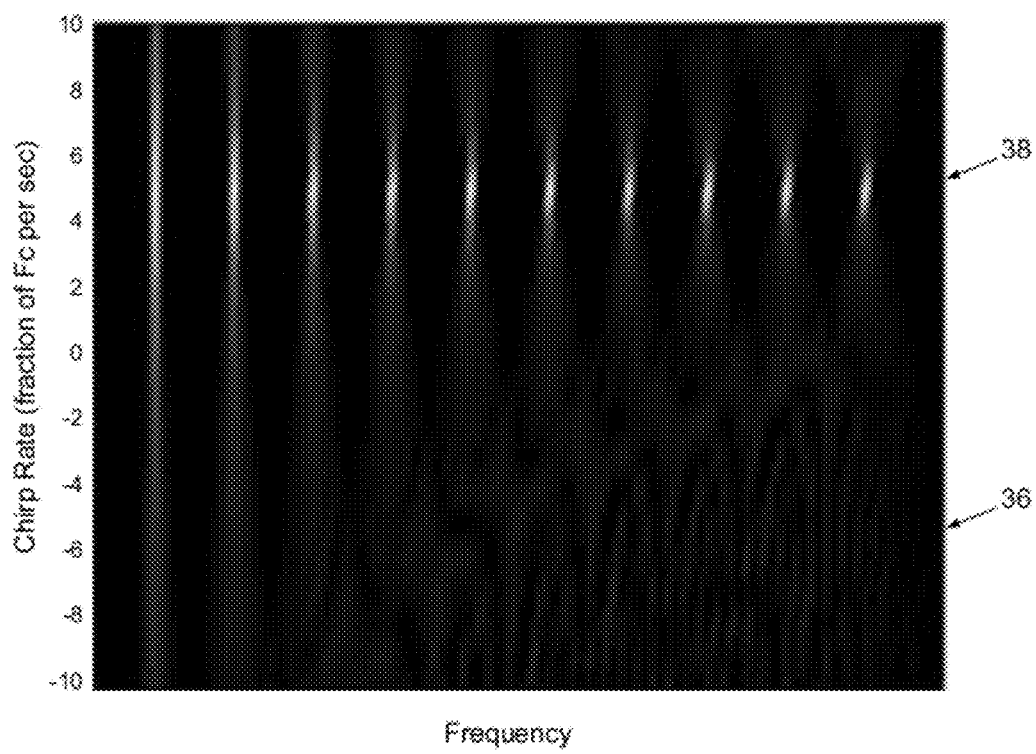
FIG. 3 illustrates a plot of a transformed sound signal in the frequency-chirp domain.

By way of illustration, FIG. 3 illustrates a chirp space 36 in a frequency-chirp domain for a transformed signal portion. In FIG. 3, the transform coefficient is represented by color, with larger magnitude transform coefficients being depicted as lighter than lower transform coefficients. Frequency may be represented along the horizontal axis of chirp space 36, and fractional chirp rate may be represented along the vertical axis of chirp space 36.

Referring back to FIG. 1, transform module 22 may be configured to transform signal portions by applying a set of filters to individual signal portions. Individual filters in the set of filters may correspond to different frequency and chirp rate variable pairs. By way of non-limiting example, a suitable set of filters ($\psi$) may be expressed as:

$$\psi_{f,c}(t) = \frac{1}{\sqrt{2\pi\sigma^2}} \exp\left[-\frac{1}{2}\left(\frac{t-t_0}{\sigma}\right)^2 + f(t-t_0)i + \frac{c}{2}(t-t_0)^2 i\right]; \qquad (2)$$

where i is the imaginary number, t represents time, f represents the center frequency of the filter, c represents the chirp rate of the filter, and $\sigma$ represents the standard deviation (e.g., the width) of the time window of the filter.

The filters applied by transform module 22 may be complex exponentials. This may result in the transform coefficients produced by the filters including both real and imaginary components. As used herein, the "transform coefficient" may refer to a complex number including both real and imaginary components, a modulus of a complex number, the square of a modulus of a complex number, and/or other representations of complex numbers and/or components thereof. Applying the filters to a signal portion may be accomplished, for example, by taking the inner product of the time data of the signal portion and the complex filter. The parameters of the filters, such as central frequency, and chirp rate, may be set based on user selection, preset settings, the sound signal being processed, and/or other factors.

The sound module 24 may be configured to identify contributions of the individual sounds (e.g., harmonic sounds) within the signal portions. The sound module 24 may make such identifications based on an analysis of frequency-chirp domain transforms of the signal portions.

As a given sound changes pitch, the change in frequency (or chirp rate) of a harmonic of the given sound may be characterized as a function of the rate at which the pitch is changing and the current frequency of the harmonic. This may be characterized for the $n^{th}$ harmonic as:

$$\Delta\phi = \omega_1(X_n/\omega_n) \qquad (3)$$

where $\Delta\phi$ represents the rate of change in pitch ($\phi$), or "pitch velocity" of the sound, $X_n$ represents the chirp rate of the $n^{th}$ harmonic, $\omega_n$ represents the frequency of the $n^{th}$ harmonic, and $\omega_1$ represents the frequency of the first harmonic (e.g., the fundamental tone). By referring to equations (1) and (2), it may be seen that the rate of change in pitch of a sound and fractional chirp rate(s) of the $n^{th}$ harmonic of the sound are closely related, and that equation (2) can be rewritten as:

$$\Delta\phi = \omega_1 \cdot \chi_n. \qquad (4)$$

Since the rate of change in pitch is a sound-wide parameter that holds for the sound as a whole, with all of its underlying harmonics (assuming a harmonic sound/source), it can be inferred from equation (3) that the fractional chirp rate may be the same for all of the harmonics of the sound. The sound module 24 may be configured to leverage this phenomenon to identify contributions of individual sounds in transformed signal portions. For example, sound module 24 may be configured to identify a common fractional chirp rate of an individual sound within a transformed signal portion.

By way of illustration, referring back to FIG. 3, the common fractional chirp rate across harmonics for an individual harmonic sound may mean the harmonic contributions of the sound may be aligned along a single horizontal row corresponding to the common fractional chirp rate for that individual sound. This row may be referred to as the "best chirp row" (see, e.g., best chirp row 38 in FIG. 3). If noise present in a signal portion is unstructured (uncorrelated in time), then most (if not substantially all) noise present in the signal portion can be assumed to have a fractional chirp rate different from a common fractional chirp rate of a sound represented in the signal portion. As such, identification of a common fractional chirp rate in a transformed signal portion (such as the one illustrated as chirp space 36) may be less susceptible to distortion due to noise than a signal portion that has not been transformed into the frequency-chirp domain.

Figure 4:
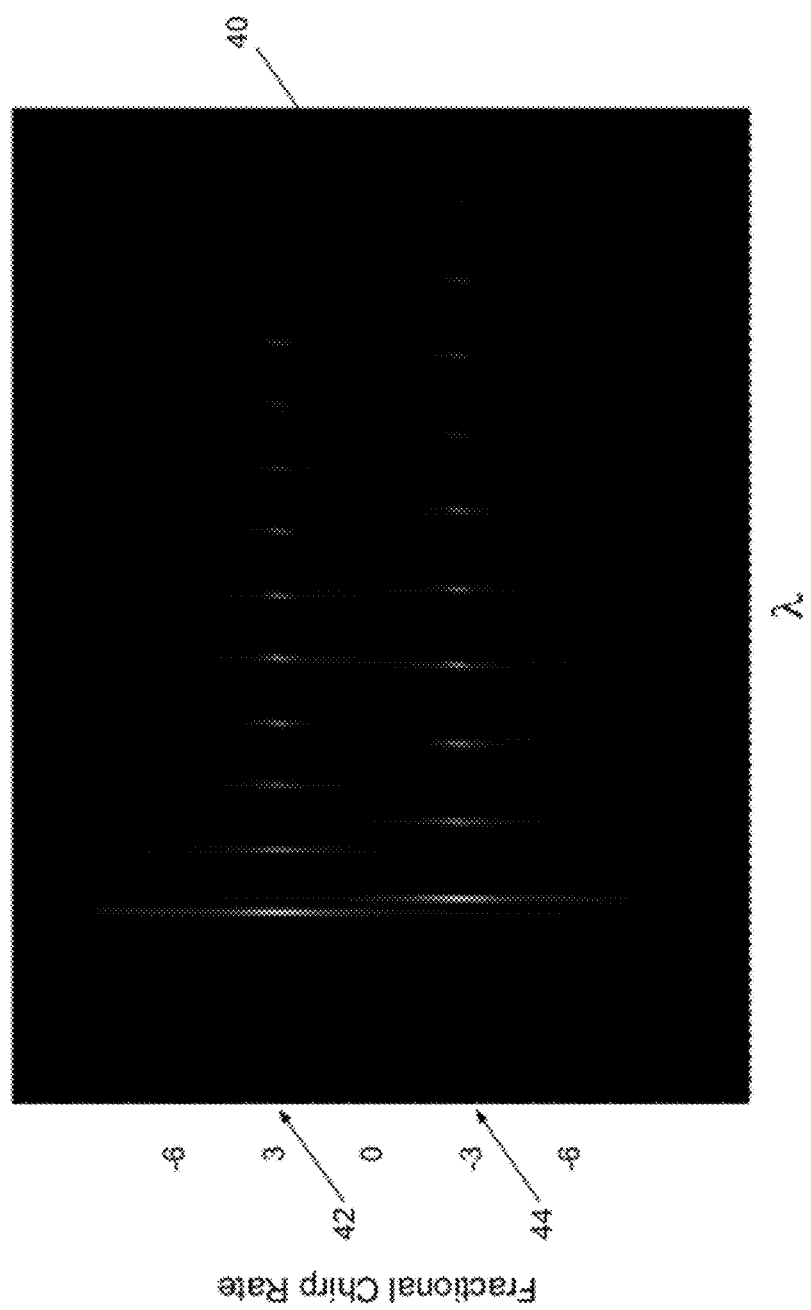
FIG. 4 illustrates a plot of a transformed sound signal in the frequency-chirp domain.

Similarly, a plurality of sounds present in a single signal portion may be distinguished in the frequency-chirp domain because they would likely have different fractional chirp rates. By way of non-limiting example, FIG. 4 illustrates a chirp space 40 in the frequency-chirp domain. The chirp space 40 may include a first best chirp row 42 corresponding to a first sound, and a second best chirp row 44 corresponding to a second sound. As can be seen in FIG. 4, each of the first sound and the second sound may have a similar pitch. As a result, conventional sound processing techniques may have difficulty distinguishing between these two distinct sounds. However, by virtue of separation along fractional chirp rate, chirp space 40 represents each of the first and second sounds separately, and facilitates identification of the two separate sounds.

Referring back to FIG. 1, sound module 24 may be configured to identify contributions of individual sounds in transformed signal portions through one or more of a variety of techniques. For example, sound module 24 may sum transform coefficients along individual fractional chirp rates and identify one or more maxima in these sums as a best chirp row corresponding to an individual sound. As another example, sound module 24 may be configured to analyze individual fractional chirp rates for the presence of harmonic contributions (e.g., regularly spaced maxima in transform coefficient). In some implementations, sound module 24 may be configured to perform the analysis described in one or both of U.S. patent application Ser. No. 13/204,483 filed Aug. 8, 2011, and entitled "System And Method For Tracking Sound Pitch Across An Audio Signal", and/or U.S. patent application Ser. No. 13/205,521, filed Aug. 8, 2011, and entitled "System And Method For Tracking Sound Pitch Across An Audio Signal Using Harmonic Envelope," which are hereby incorporated by reference into the present application in their entireties.

The sound parameter module 26 may be configured to determine one or more parameters of sounds represented in the transformed signal portions. These one or more parameters may include, for example, pitch, envelope, pitch velocity, and/or other parameters. By way of non-limiting example, sound parameter module 26 may determine pitch and/or envelope by analyzing the transform coefficient versus frequency information along a best chirp row in much the same manner that conventional sound processing systems analyze a sound signal that has been transformed into the frequency domain (e.g., using Fast Fourier Transform ("FFT") or Short Time Fourier Tranform ("STFT")). Analysis of the transform coefficient versus frequency information may provide for enhanced accuracy and/or precision at least because noise present in the transformed signal portions having chirp rates other than the common chirp rate of the best chirp row may not be present. Techniques for determining pitch and/or envelope from sounds signals may include one or more of cepstral analysis and harmonic product spectrum in the frequency domain, and zero-crossing rate, auto-correlation and phase-loop analysis in the time domain, and/or other techniques.

The classification module 28 may be configured to group sounds represented in the transformed signal portions according to common sound sources. This grouping may be accomplished through analysis of transform coefficients of the transformed signal portions. For example, classification module 28 may group sounds based on parameters of the sounds determined by sound parameter module 26, analyzing the transform coefficient versus frequency information along a best chirp row (e.g., including creating vectors of transform coefficient maxima along the best chirp row), and/or through other analysis. The analysis performed by classification module 28 may be similar to or the same as analysis performed in conventional sound processing systems on a sound signal that has been transformed into the frequency domain. Some of these techniques for analyzing frequency domain sound signals may include, for example, Gaussian mixture models, support vector machines, Bhattacharyya distance, and/or other techniques.

Processor 12 may be configured to provide information processing capabilities in system 10. As such, processor 12 may include one or more of a digital processor, an analog processor, a digital circuit designed to process information, an analog circuit designed to process information, a state machine, and/or other mechanisms for electronically processing information. Although processor 12 is shown in FIG. 1 as a single entity, this is for illustrative purposes only. In some implementations, processor 12 may include a plurality of processing units. These processing units may be physically located within the same device, or processor 12 may represent processing functionality of a plurality of devices operating in coordination.

Processor 12 may be configured to execute modules 18, 20, 22, 24, 26, and/or 28 by software; hardware; firmware; some combination of software, hardware, and/or firmware; and/or other mechanisms for configuring processing capabilities on processor 12. It should be appreciated that although modules 18, 20, 22, 24, 26, and 28 are illustrated in FIG. 1 as being co-located within a single processing unit, in implementations in which processor 38 includes multiple processing units, one or more of modules 18, 20, 22, 24, 26, and/or 28 may be located remotely from the other modules. The description of the functionality provided by the different modules 18, 20, 22, 24, 26, and/or 28 described below is for illustrative purposes, and is not intended to be limiting, as any of modules 18, 20, 22, 24, 26, and/or 28 may provide more or less functionality than is described. For example, one or more of modules 18, 20, 22, 24, 26, and/or 28 may be eliminated, and some or all of its functionality may be provided by other ones of modules 18, 20, 22, 24, 26, and/or 28. As another example, processor 12 may be configured to execute one or more additional modules that may perform some or all of the functionality attributed below to one of modules 18, 20, 22, 24, 26, and/or 28.

In one embodiment, electronic storage 14 comprises non-transitory electronic storage media. The electronic storage media of electronic storage 14 may include one or both of system storage that is provided integrally (i.e., substantially non-removable) with system 10 and/or removable storage that is removably connectable to system 10 via, for example, a port (e.g., a USB port, a firewire port, etc.) or a drive (e.g., a disk drive, etc.). Electronic storage 14 may include one or more of optically readable storage media (e.g., optical disks, etc.), magnetically readable storage media (e.g., magnetic tape, magnetic hard drive, floppy drive, etc.), electrical charge-based storage media (e.g., EEPROM, RAM, etc.), solid-state storage media (e.g., flash drive, etc.), and/or other electronically readable storage media. Electronic storage 14 may include virtual storage resources, such as storage resources provided via a cloud and/or a virtual private network. Electronic storage 14 may store software algorithms, computer program modules, information determined by processor 12, information received via user interface 16, and/or other information that enables system 10 to function properly. Electronic storage 14 may be a separate component within system 10, or electronic storage 14 may be provided integrally with one or more other components of system 14 (e.g., processor 12).

User interface 16 may be configured to provide an interface between system 10 and one or more users to provide information to and receive information from system 10. This information may include data, results, and/or instructions and any other communicable items or information. For example, the information may include analysis, results, and/or other information generated by transform module 22, sound module 24, and/or sound parameter module 26. Examples of interface devices suitable for inclusion in user interface 16 include a keypad, buttons, switches, a keyboard, knobs, levers, a display screen, a touch screen, speakers, a microphone, an indicator light, an audible alarm, and a printer.

It is to be understood that other communication techniques, either hard-wired or wireless, are also contemplated by the present invention as user interface 16. For example, the present invention contemplates that user interface 16 may be integrated with a removable storage interface provided by electronic storage 14. In this example, information may be loaded into system 10 from removable storage (e.g., a smart card, a flash drive, a removable disk, etc.) that enables the user(s) to customize the implementation of system 10. Other exemplary input devices and techniques adapted for use with system 10 as user interface 16 include, but are not limited to, an RS-232 port, RF link, an IR link, modem (telephone, cable or other). In short, any technique for communicating information with system 10 is contemplated by the present disclosure as user interface 16.

Figure 5:
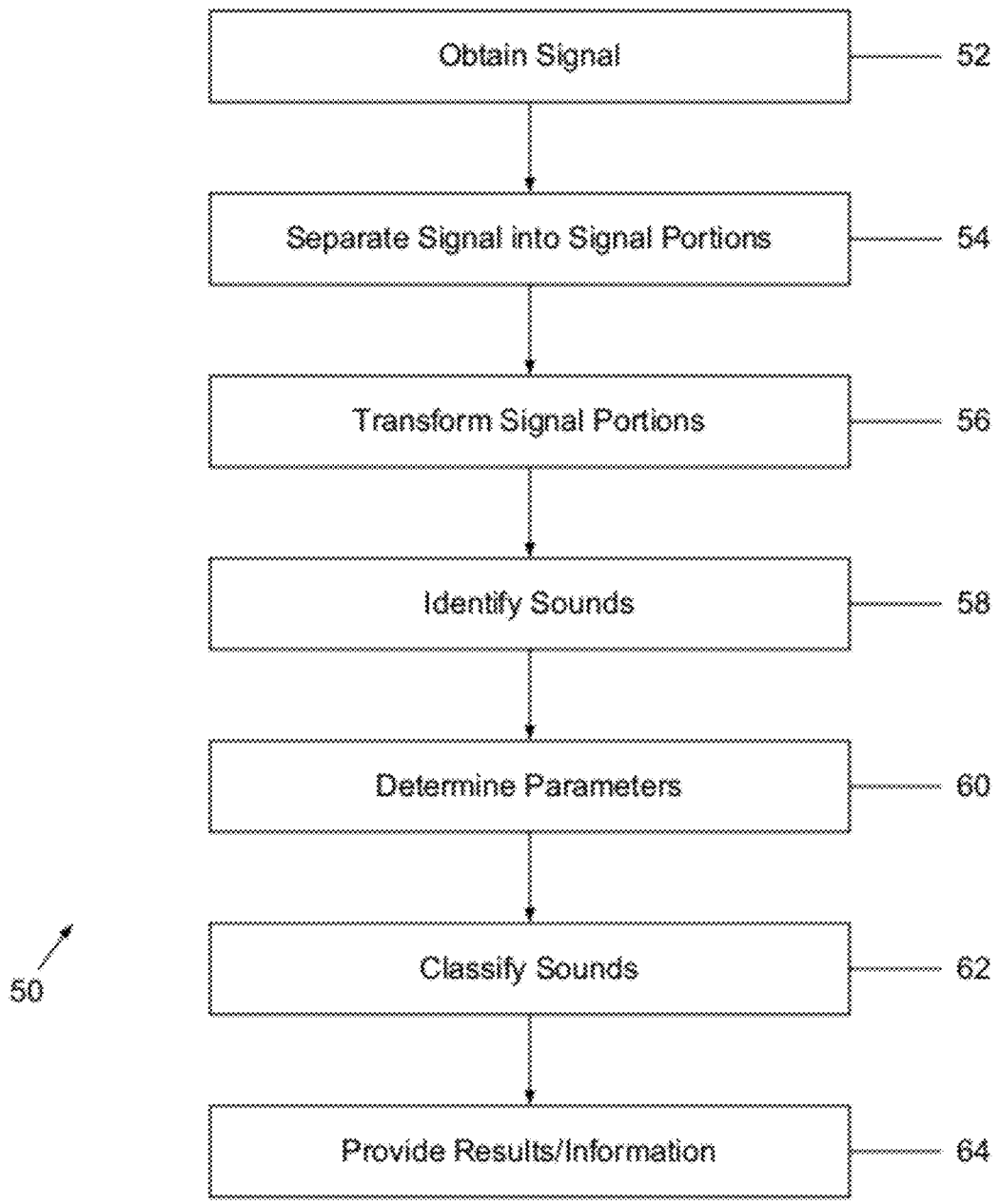
FIG. 5 illustrates a method of processing a sound signal.

FIG. 5 illustrates a method 50 of processing a sound signal. The operations of method 50 presented below are intended to be illustrative. In some embodiments, method 50 may be accomplished with one or more additional operations not described, and/or without one or more of the operations discussed. Additionally, the order in which the operations of method 50 are illustrated in FIG. 5 and described below is not intended to be limiting.

In some embodiments, method 50 may be implemented in one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of method 50 in response to instructions stored electronically on an electronic storage medium. The one or more processing devices may include one or more devices configured through hardware, firmware, and/or software to be specifically designed for execution of one or more of the operations of method 50.

At an operation 52, a sound signal may be obtained. The sound signal may be obtained from electronic storage, from a user interface, and/or from other sources. The sound signal may include an electronic analog and/or a digital signal that represents sounds generated by sources and/or noise. The sound signal may specify an amplitude as a function of time. The sound signal may have a sampling rate at which amplitude/frequency are represented. The sampling rate may correspond to a sampling period. In some implementations, operation 52 may be performed by a signal module that is the same as or similar to signal module 18 (shown in FIG. 1 and described herein).

At an operation 54, the sound signal may be separated into a set of signal portions. The signal portions may be associated with individual time windows. The time windows may be consecutive across time, may overlap, may be spaced apart, and/or may be arranged over time in other ways. An individual time window may correspond to a period of time that is greater than the sampling period of the sound signal being separated into signal portions. As such, the signal potion associated with a time window may include a plurality of signal samples. In some implementations, operation 54 may be performed by a time window module that is the same as or similar to time window module 20 (shown in FIG. 1 and described herein).

At an operation 56, the signal portions may be transformed into the frequency-chirp domain. The frequency-chirp domain may be given by frequency and (fractional) chirp rate. The frequency-chirp domain may have a co-domain (output) given by the transform coefficient. The chirp rate variable may be a metric derived from chirp rate (e.g., or rate of change in frequency). As such, upon performance of the transform at operation 56, a transformed signal portion may specify a transform coefficient as a function of frequency and fractional chirp rate for the time window associated with the transformed signal portion. In some implementations, operation 56 may be performed by a transform module that is the same as or similar to transform module 22 (shown in FIG. 1 and described herein).

At an operation 58, individual sounds within the signal portions may be identified based on the transformed signal portions. Identifying individual sounds within the signal portions may include identifying the harmonics of the individual sounds, identifying the fractional chirp rate for individual sounds (e.g., the best chirp row of individual sounds), and/or other manifestations of the individual sounds in the transformed signal portions. In some implementations, operation 58 may be performed by a sound module that is the same as or similar to sound module 24 (shown in FIG. 1 and described herein).

At an operation 60, one or more sound parameters of the sounds identified at operation 58 may be determined. The sound parameters may include one or more of pitch, pitch velocity, envelope, and/or other sound parameters. The determination made at operation 60 may be made based on the transformed signal portions. In some implementations, operation 60 may be performed by a sound parameter module 26 that is the same as or similar to sound parameter module 26 (shown in FIG. 1 and described herein).

At an operation 64, the sounds identified at operation 58 may be classified. This may include grouping sounds represented in the transformed signal portions according to common sound sources. The classification may be performed based on the sound parameters determined at operation 60, the transformed sound signals, and/or other information. In some implementations, operation 64 may be performed by a classification module that is the same as or similar to classification module 28 (shown in FIG. 1 and described herein).

At an operation 64, information related to one or more of operations 52, 56, 58, 60, and/or 64 may be provided to one or more users. Such information may include information related to a transformed signal portion, transform coefficient versus frequency information for a given fractional chirp rate, a representation of a transformed signal portion in the frequency-chirp domain, one or more sound parameters of a sound represented in a signal portion or sound signal, information related to sound classification, and/or other information. Such information may be provided to one or more users via a user interface that is the same as or similar to user interface 16 (shown in FIG. 1 and described herein).

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A system configured to process a sound signal, the system comprising:
    one or more processors configured to execute computer program modules, the computer program modules comprising:
    a time window module configured to separate a sound signal into signal portions associated with individual time windows, wherein the time windows correspond to a period of time greater than a sampling period of the sound signal; and
    a transform module configured to transform the signal portions into a frequency-chirp domain, wherein the frequency-chirp domain representation of the sound signal specifies a transform coefficient as a function of frequency and fractional chirp rate for the signal portions, wherein the fractional chirp rate is chirp rate divided by frequency.

2. The system of claim 1, wherein the computer program modules further comprise a sound parameter module configured to determine, based on the transformed signal portions, a first sound parameter of individual harmonic sounds represented in the sound signal.

3. The system of claim 2, wherein the sound parameter module is configured to determine the first sound parameter on a per signal portion basis.

4. The system of claim 2, wherein the sound parameter module is further configured to determine, based on the transformed signal portions, a second sound parameter of individual harmonic sounds represented in the sound signal, the second sound parameter being a different parameter than the first sound parameter.

5. The system of claim 2, wherein the first sound parameter includes one or both of pitch and/or chirp rate.

6. The system of claim 1, wherein the transform module is configured such that the transform of a given signal portion is obtained by applying a set of filters to the given signal portion, wherein individual filters in the set of filters correspond to different frequency and chirp rate pairs.

7. The system of claim 1, wherein the transform module is configured such that the transform coefficient comprises a real component and an imaginary component.

8. The system of claim 1, wherein the transform module is configured such that the transform coefficient is modulus squared of a real component and an imaginary component.

9. The system of claim 1, further comprising a classification module configured to identify sounds generated by separate sources based on the transform coefficients.

10. A method of processing a sound signal, the method comprising:
    separating a sound signal into signal portions associated with individual time windows, wherein the time windows correspond to a period of time greater than a sampling period of the sound signal; and
    transforming the signal portions into a frequency-chirp domain, wherein the frequency-chirp domain representation of a given signal portion specifies a transform coefficient as a function of frequency and fractional chirp rate for the signal given portion, wherein the fractional chirp rate is chirp rate divided by frequency.

11. The method of claim 10, further comprising determining, based on the transformed signal portions, a first sound parameter of individual harmonic sounds represented in the sound signal.

12. The method of claim 11, wherein determining the first sound parameter comprises determining the first parameter on a per signal portion basis.

13. The method of claim 11, further comprising determining, based on the transformed signal portions, a second sound parameter of individual harmonic sounds represented in the sound signal, the second sound parameter being a different parameter than the first sound parameter.

14. The method of claim 11, wherein the first sound parameter includes one or both of pitch and/or chirp rate.

15. The method of claim 10, wherein transforming a given signal portion comprises applying a set of filters to the given signal portion, wherein individual filters in the set of filters correspond to different frequency and chirp rate pairs.

16. The method of claim 10, wherein the transform coefficient comprises a real component and an imaginary component.

17. The method of claim 10, wherein the transform coefficient is modulus squared of a real component and an imaginary component.

18. The method of claim 10, further comprising identifying sounds generated by separate sources based on the transform coefficients.

19. Non-transitory, machine-readable electronic storage media that stores processor-executable instructions for performing a method of processing a sound signal, the method comprising:
    separating a sound signal into signal portions associated with individual time windows, wherein the time windows correspond to a period of time greater than a sampling period of the sound signal; and
    transforming the signal portions into the frequency-chirp domain, wherein a frequency-chirp domain representation of a given signal portion specifies a transform coefficient as a function of frequency and fractional chirp rate for the given signal portion, wherein the fractional chirp rate is chirp rate divided by frequency.

20. The electronic storage media of claim 19, wherein the method further comprises determining, based on the transformed signal portions, a first sound parameter of individual harmonic sounds represented in the sound signal.

* * * * *